US010622455B2

(12) United States Patent
Cao et al.

(10) Patent No.: US 10,622,455 B2
(45) Date of Patent: Apr. 14, 2020

(54) ENHANCEMENT-MODE GAN TRANSISTOR WITH SELECTIVE AND NONSELECTIVE ETCH LAYERS FOR IMPROVED UNIFORMITY IN GAN SPACER THICKNESS

(71) Applicant: Efficient Power Conversion Corporation, El Segundo, CA (US)

(72) Inventors: Jianjun Cao, Torrance, CA (US); Robert Beach, La Crescenta, CA (US); Guangyuan Zhao, Torrance, CA (US); Yoganand Saripalli, El Segundo, CA (US); Zhikai Tang, Torrance, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 16/006,981

(22) Filed: Jun. 13, 2018

(65) Prior Publication Data
US 2018/0366559 A1  Dec. 20, 2018

Related U.S. Application Data

(60) Provisional application No. 62/520,262, filed on Jun. 15, 2017.

(51) Int. Cl.
*H01L 29/66* (2006.01)
*H01L 29/778* (2006.01)
(Continued)

(52) U.S. Cl.
CPC .. *H01L 29/66462* (2013.01); *H01L 21/30621* (2013.01); *H01L 29/1066* (2013.01); *H01L 29/432* (2013.01); *H01L 29/7786* (2013.01); *H01L 29/7787* (2013.01); *H01L 21/28587* (2013.01); *H01L 27/0605* (2013.01); *H01L 29/2003* (2013.01); *H01L 29/41766* (2013.01)

(58) Field of Classification Search
CPC ........... H01L 29/66462; H01L 29/1066; H01L 29/432; H01L 29/7786; H01L 29/7787; H01L 21/30621; H01L 21/28587; H01L 27/0605
See application file for complete search history.

(56) References Cited

U.S. PATENT DOCUMENTS 5,940,694 A * 8/1999 Bozada ............... H01L 21/7605
257/E21.452
7,851,825 B2  12/2010 Suh et al.
(Continued)

OTHER PUBLICATIONS

S. Heikman et al., "Polarization effects in AlGaN/GaN and GaN/AlGaN/GaN heterostructures", Journal of Applied Physics, vol. 93, No. 12, 2003, pp. 10114-10118.

*Primary Examiner* — Patricia D Reddington
(74) *Attorney, Agent, or Firm* — Blank Rome LLP

(57) ABSTRACT

An enhancement-mode transistor gate structure which includes a spacer layer of GaN disposed above a barrier layer, a first layer of pGaN above the spacer layer, an etch stop layer of p-type Al-containing column III-V material, for example, pAlGaN or pAlInGaN, disposed above the first p-GaN layer, and a second p-GaN layer, having a greater thickness than the first p-GaN layer, disposed over the etch stop layer. The etch stop layer minimizes damage to the underlying barrier layer during gate etching steps, and improves GaN spacer thickness uniformity.

9 Claims, 12 Drawing Sheets

(51) Int. Cl.
    *H01L 29/43*     (2006.01)
    *H01L 21/306*     (2006.01)
    *H01L 29/10*     (2006.01)
    *H01L 29/20*     (2006.01)
    *H01L 29/417*     (2006.01)
    *H01L 21/285*     (2006.01)
    *H01L 27/06*     (2006.01)

(56) References Cited

U.S. PATENT DOCUMENTS

| | | |
|---|---|---|
| 8,404,508 B2 | 3/2013 | Lidow et al. |
| 8,946,771 B2 | 2/2015 | Hsiung et al. |
| 2006/0273347 A1 | 12/2006 | Hikita et al. |
| 2008/0048173 A1 | 2/2008 | Sadaka et al. |
| 2009/0146182 A1* | 6/2009 | Hikita ................ H01L 29/2003 257/190 |
| 2010/0025771 A1 | 2/2010 | Hoentschel et al. |
| 2014/0091322 A1* | 4/2014 | Ishikura ................ H01L 29/452 257/76 |
| 2015/0249134 A1 | 9/2015 | Ostermaier et al. |
| 2016/0064539 A1 | 3/2016 | Lu et al. |

* cited by examiner

US 10,622,455 B2

ENHANCEMENT-MODE GAN TRANSISTOR WITH SELECTIVE AND NONSELECTIVE ETCH LAYERS FOR IMPROVED UNIFORMITY IN GAN SPACER THICKNESS

CROSS REFERENCE TO RELATED APPLICATIONS

This application claims priority from U.S. Provisional Application No. 62/520,262, filed on Jun. 15, 2017, the disclosure of which is hereby incorporated herein by reference in its entirety.

FIELD OF THE INVENTION

The present invention relates to the field of enhancement-mode transistor structures such as gallium nitride (GaN) transistor structures. More particularly, the invention relates to GaN transistor gate structures with an etch stop p-type Al-containing column III-V material layer of, for example, pAlGaN or pAlInGaN, positioned above at least one spacer layer of, for example, pGaN.

BACKGROUND OF THE INVENTION

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Different materials formed on the semiconductor or on a buffer layer cause the layers to have different band gaps. The different material in the adjacent nitride layers also causes polarization, which contributes to a conductive two-dimensional electron gas (2 DEG) region near the junction of the two layers, specifically in the layer with the narrower band gap.

The nitride layers that cause polarization typically include a barrier layer of AlGaN adjacent to a layer of GaN to include the 2 DEG, which allows charge to flow through the device. This barrier layer may be doped or undoped. Because the 2 DEG region exists under the gate at zero gate bias, most nitride devices are normally on, or depletion mode devices. If the 2 DEG region is depleted, i.e. removed, below the gate at zero applied gate bias, the device can be an enhancement-mode device. Enhancement-mode devices are normally off and are desirable because of the added safety they provide and because they are easier to control with simple, low cost drive circuits. An enhancement-mode device requires a positive bias applied at the gate in order to conduct current.

FIG. 1 illustrates a cross-sectional view of a conventional field-effect transistor (FET) 100, and is more fully described in U.S. Patent Application Publication No. 2006/0273347. FET 100 of FIG. 1 includes a substrate 101, an AlN buffer layer 102 formed on the substrate 101, a GaN layer 103 formed on the AN buffer layer 102, an AlGaN barrier layer 104 formed on the GaN layer 103. The gate is formed of a p-type GaN layer 105 formed over part of the AlGaN layer 104, and a heavily doped p-type GaN layer 106 formed on the p-type GaN layer 105. A shortcoming of this device/FET 100 is that the barrier layer (AlGaN layer 104) is partially etched away when the gate (e.g., p-type GaN layer 105) is etched. It is desired to not damage the barrier layer 104, so as to have a uniform barrier layer across the device.

FIG. 2 illustrates a cross-sectional view of a conventional step in formation of a typical enhancement-mode GaN HEMT device 200a, and is more fully described in U.S. Pat. No. 8,404,508. Device 200a of FIG. 2 includes a silicon substrate 11, transition layers 12, GaN buffer material 13, AlGaN barrier material/layer 14, p-type GaN gate layer 15, and gate metal 17. A single photo mask is used to pattern and etch the gate metal 17 and the p-type GaN gate layer 15, resulting in the structure/device 200a shown in FIG. 2. The gate metal 17 and the p-type GaN gate layer 15 are etched by any known technique, e.g., plasma etching, followed by a photoresist strip. The p-type GaN gate layer 15 can be under-etched, leaving about 0 to about 10 nm of the gate material outside of the gate region. The gate layer 15 can also be over-etched, removing about 0 to about 3 nm of the barrier layer 14 outside of the gate region. In the over-etching case, the barrier layer 14 is about 0 to about 3 nm thinner outside of the gate region than that in the gate region. Device 200a has a number of shortcomings: (i) the gate layer 15 thickness has non uniformity from EPI growth; (ii) the wafer fabrication etch rate to gate layer 15 has, non uniformity across a wafer, from wafer to wafer, and from lot to lot; (iii) the non-uniformity in gate layer 15 thickness and etch rate non uniformity lead to either leaving an uneven amount of residual layer 15 material over barrier layer 14 or over-etching and damage of barrier layer 14 elsewhere on the wafer. Again, it is desired to have a uniform barrier layer 14.

FIG. 3 illustrates a cross-sectional view of a conventional step in formation of a typical enhancement-mode GaN transistor device 800, and is more fully described in U.S. Pat. No. 8,946,771. Device 800 of FIG. 3 includes a GaN layer 202, an AlGaN electron supply layer 204 located on top of the GaN layer 202, an AlN etch stop layer 206 located on top of the AlGaN electron supply layer 204, a p-type GaN layer 208 located on top of the AlN etch stop layer 206, and a titanium gate metal 210 located on top of the p-type GaN layer 208. A patterned photoresist (P/R) layer 802 is formed on top of the gate metal 210 to mask a region of the substrate that defines a gate structure of the GaN device, by covering the gate metal 210 in the gate region. As mentioned above, a thin AlN layer 206 is disposed between pGaN layer 208 and AlGaN layer 204 (front barrier). The AlN layer 206 serves as gate pGaN etch stop. This enables over-etching of pGaN to completely etch away pGaN outside of the gate region. Device 800 has the following shortcomings: (a) the AlN layer 206 under the pGaN layer 208 decreases the threshold voltage Vth, and tends to make the device toward depletion-mode (D-mode); and (b) the front barrier (AlGaN layer 204) is not protected by a GaN cap layer. It is desired to have a gate etch stop layer without decreasing Vth. It is also desired to have a GaN cap layer over the front barrier outside of the gate region.

FIG. 4 illustrates a cross-sectional view of a conventional depletion mode HEMT FET 400 as described in S. Heikman et al., "Polarization effects in AlGaN/GaN and GaN/AlGaN/GaN heterostructures," Journal of Applied Physics, Vol. 93, No. 12, 2003, pp. 10114-10118. Device 400 of FIG. 4 includes a front barrier AlGaN 402 overlying a GaN base 401. A thin GaN cap layer 403 overlies the front barrier AlGaN 402, but only in the gate region. This configuration improves depletion mode HEMT FET performance. However, device/FET 400 is only operable for depletion mode HEMT FETs. It is desired to have an enhancement-mode transistor device with a GaN cap layer outside of the gate region.

It therefore would be desirable to provide an enhancement-mode transistor structure that minimizes or eliminates damage to the underlying barrier layer during gate etching steps, and improves GaN spacer thickness uniformity.

SUMMARY OF THE INVENTION

The present invention in the various embodiments described below addresses the problems discussed above and other problems, by providing an enhancement-mode transistor gate structure that includes an etch stop layer of pAlGaN (or pAlInGaN) disposed near the front barrier layer, with first and second layers of pGaN (or pAlGaN or pAlInGaN) below and above the etch stop layer, and a GaN spacer layer disposed directly above the barrier layer. The layers above and below the etch stop layer have a lower Al content than the etch stop layer. Advantageously, during manufacturing of the transistor structure, the etch stop layer minimizes or eliminates damage to the barrier layer during gate etching steps, and improves the uniformity of the GaN spacer layer thickness.

Additional embodiments and additional features of embodiments for the enhancement-mode transistor gate structure and a method for fabricating the enhancement-mode transistor gate structure are described below.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. This detailed description is intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

The present invention is directed to an enhancement-mode transistor gate structure which includes, inter alia, a gate spacer layer of GaN disposed above a barrier layer, a first layer of pGaN (or pAlGaN) disposed above the gate spacer layer, an etch stop layer of p-type Al-containing column III-V material, for example, pAlGaN or pAlInGaN, disposed above the pGaN layer, and a second layer of pGaN (or pAlGaN) disposed above the etch stop layer. The p-type Al-containing column III-V material layer serves as an etch stop during manufacturing of the transistor structure, thereby minimizing or eliminating damage to the underlying barrier layer during gate etching steps, and improving the uniformity of the GaN spacer layer thickness.

Figure 1:
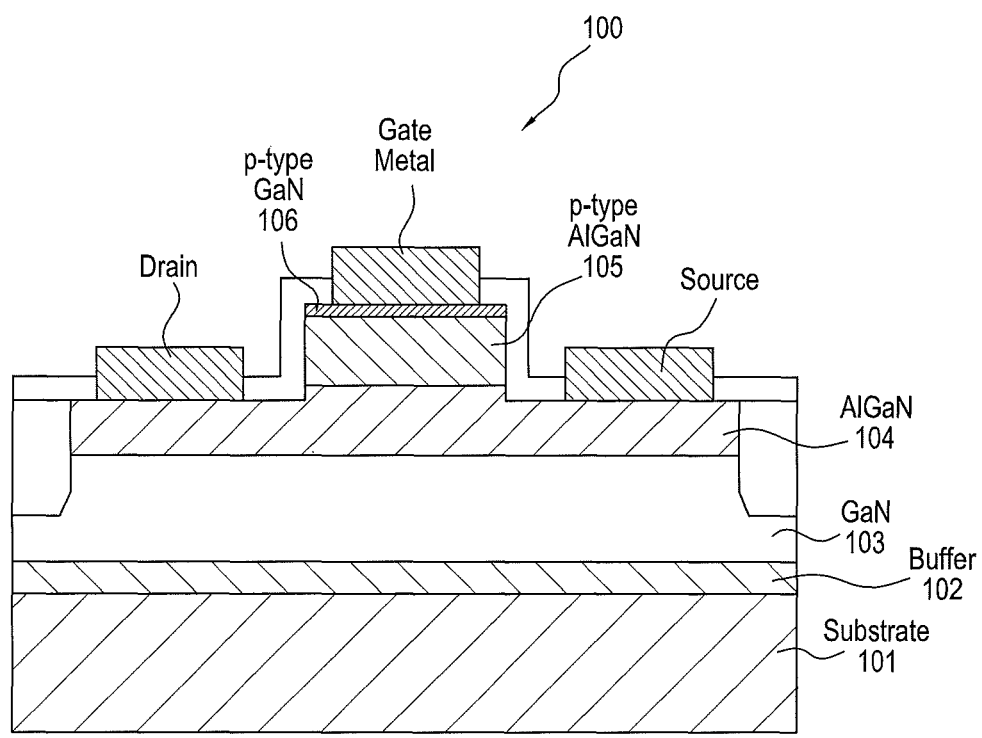
FIG. 1 illustrates a cross-sectional view of a conventional FET.
Figure 2:
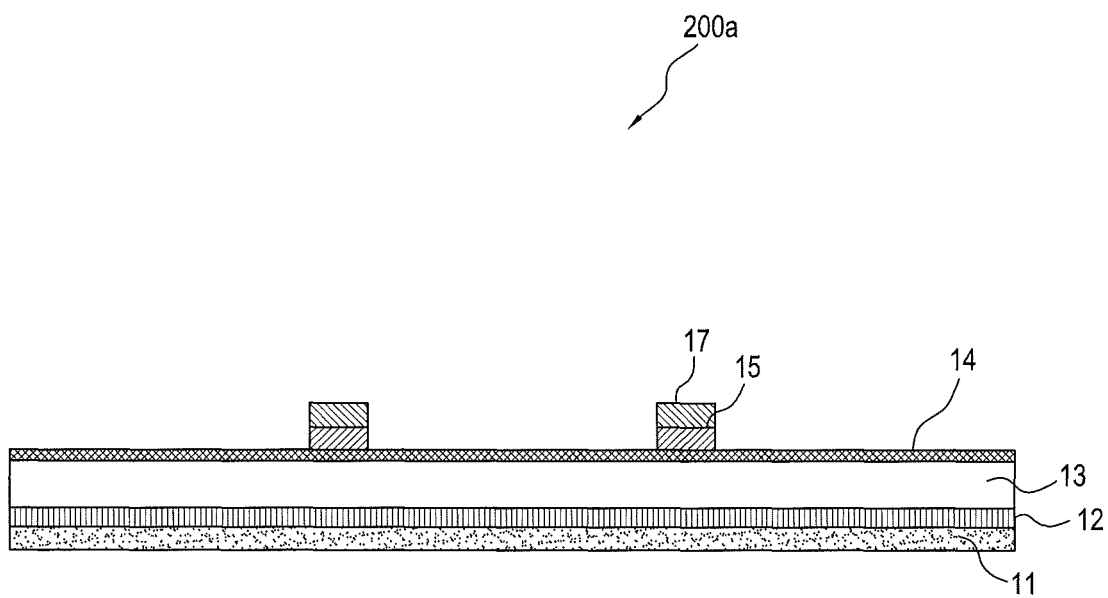
FIG. 2 illustrates a cross-sectional view of a conventional step in formation of a typical enhancement-mode GaN HEMT device.
Figure 3:
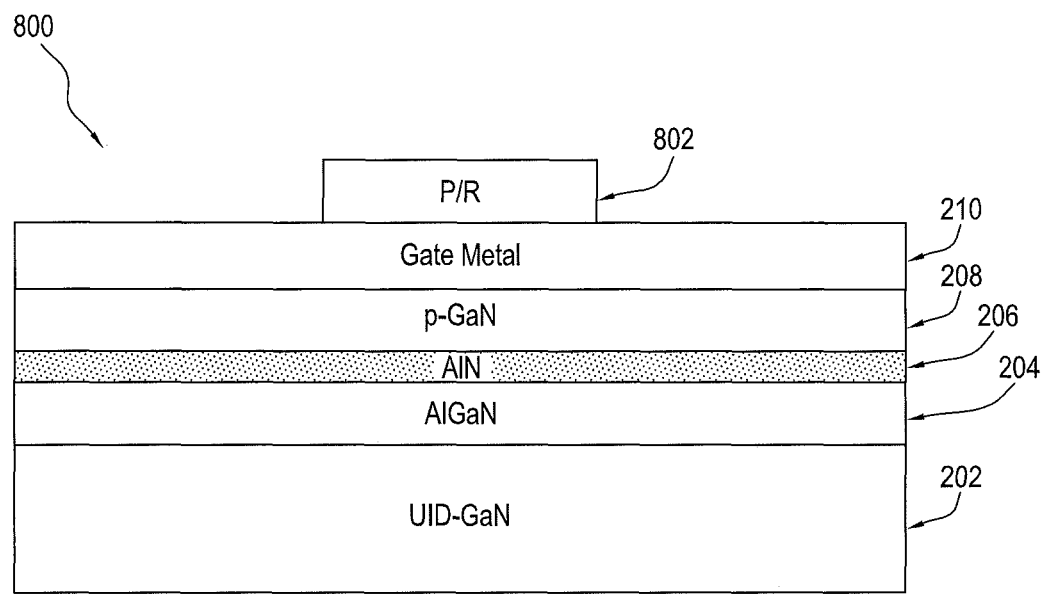
FIG. 3 illustrates a cross-sectional view of a conventional step in formation of a typical enhancement-mode GaN transistor device.
Figure 4:
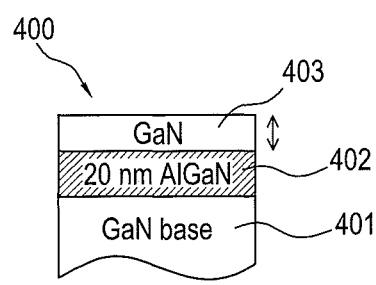
FIG. 4 illustrates a cross-sectional view of a conventional depletion-mode HEMT FET.
Figure 5:
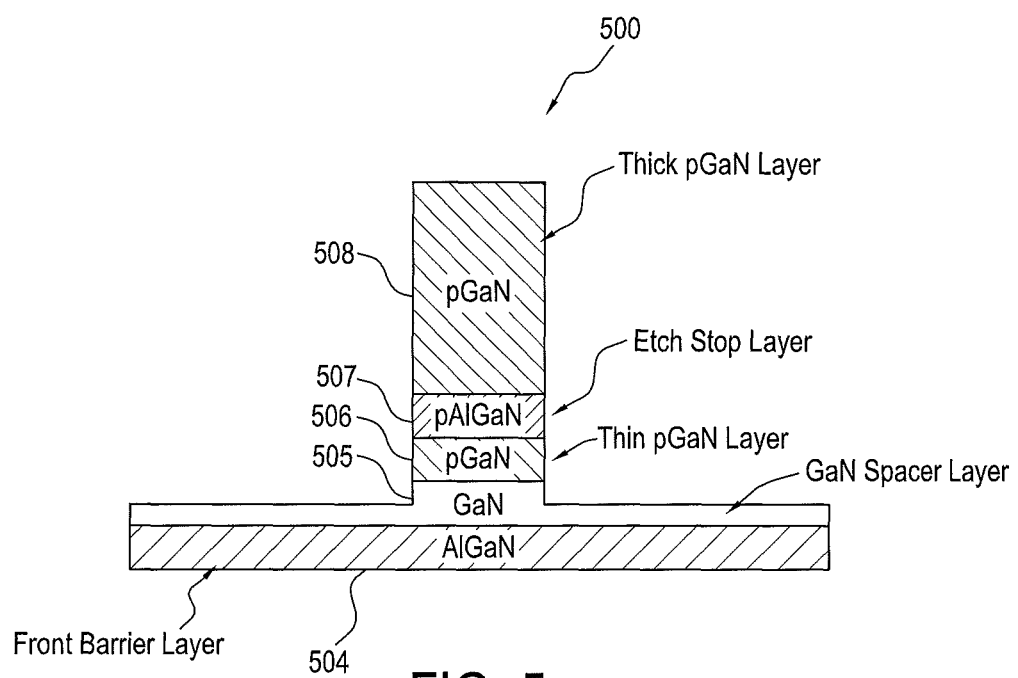
FIG. 5 illustrates a cross-sectional view of an enhancement-mode transistor structure formed according to a first embodiment of the present invention.

FIG. 5 illustrates a cross-sectional view of an enhancement-mode transistor structure 500 formed according to a first embodiment of the present invention. As shown in the embodiment of FIG. 5, the present invention is directed to an enhancement-mode transistor gate structure 500, comprising: an AlGaN front barrier layer 504; a GaN spacer layer 505 disposed above the barrier layer, a p-GaN layer 506 disposed above GaN layer 505; a pAlGaN etch stop layer 507 disposed above the p-GaN layer 506, and a pGaN layer 508 disposed above pAlGaN etch stop layer 507. The barrier layer 504 may comprise one or more barrier layers.

In a preferred embodiment, the pAlGaN etch stop layer 507 has a thickness of 0.5 nm to 2 nm. The pGaN layer 506 has a thickness of 1 nm to 30 nm, and is thinner than the pGaN layer 508, which has a thickness of 20 nm to 100 nm. The GaN gate spacer layer 505 has a thickness of 1 nm to 6 nm, and is thicker below the etch stop layer 507 than in surrounding areas.

The gate spacer layer 505, although preferably formed of GaN, can comprise any III-V gate material, either undoped or N-type or lightly doped p-type. Layers 506 and 508, below and above the etch stop layer 507 are preferably pGaN, but can also be AlGaN or AlInGaN (or any p-type or compensated III-V gate material), and their Al content is lower than the Al content of pAlGaN etch stop layer 507 (which can be formed of any p-type III-V material containing Al).

The etch stop layer 507 is indicated above to be pAlGaN, but, in a second preferred embodiment, it may also be $pAl_xIn_yGa_zN$, where $x+y+z=1$. Likewise, the barrier layer 504 may be AlGaN or AlInGaN.

Figure 6:
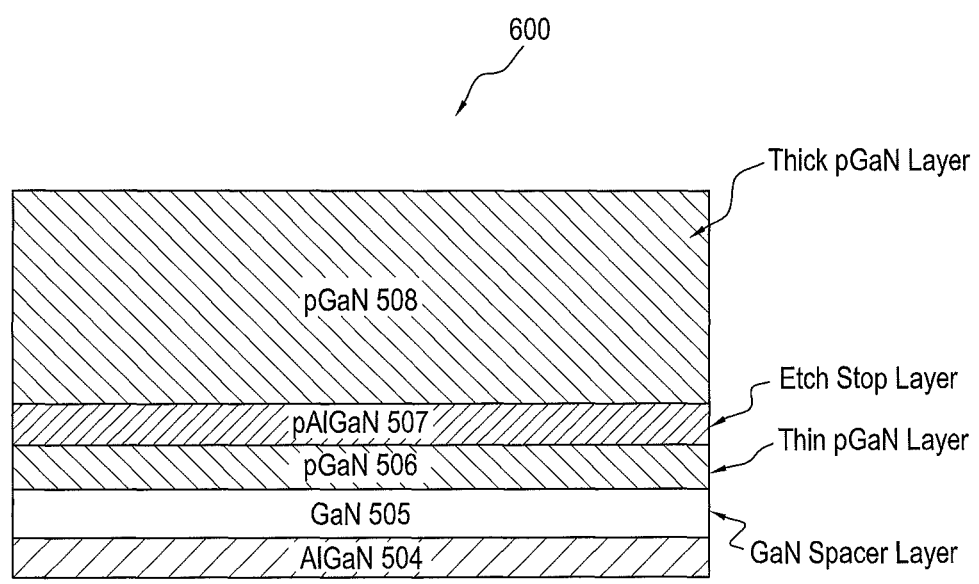
FIG. 6 illustrates a cross-sectional view of the starting gate structure in an exemplary process flow for fabricating the enhancement-mode transistor structure according to the first embodiment of the present invention.

FIG. 6 illustrates a cross-sectional view of the starting structure 600 in the process for fabricating the enhancement-mode transistor structure 500 according to the first embodiment of the present invention. As shown in FIG. 6, the gate structure of the device is formed with pGaN layer 508 disposed above the pAlGaN layer 507, which is disposed above pGaN 506, which is disposed above the GaN spacer 505, which is disposed above the AlGaN front barrier layer 504. The pGaN layer 506 is thinner than the pGaN layer 508.

Figure 7:
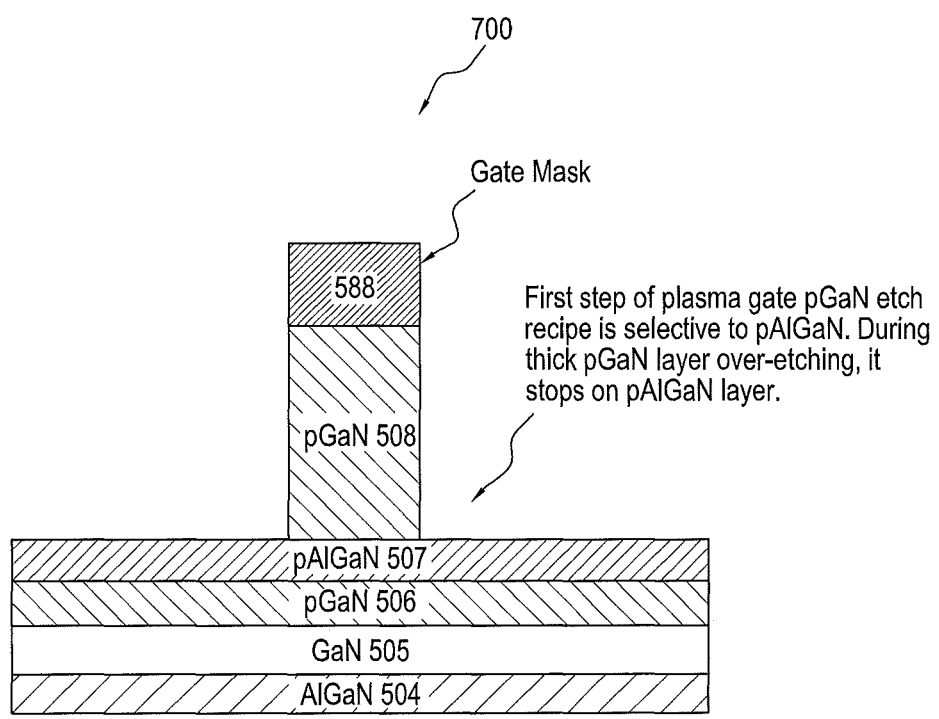
FIG. 7 illustrates a cross-sectional view of the gate structure after a first etch in the process for fabricating the enhancement-mode transistor structure according to the first embodiment of the present invention.

FIG. 7 illustrates a cross-sectional view of the gate structure 700 after the first etch step in the process for fabricating the enhancement-mode transistor structure 500 according to the first embodiment of the present invention. A gate mask 588 is positioned above the pGaN layer 508 and a first plasma gate etch of pGaN layer 508 (i.e., outside the gate/masked region) is performed with an etch recipe that is selective to the pAlGaN layer 507. During pGaN layer 508 over-etching, the etch stops on pAlGaN layer 507. The plasma employed in this first etch is preferably $Cl_2+O_2$.

Figure 8:
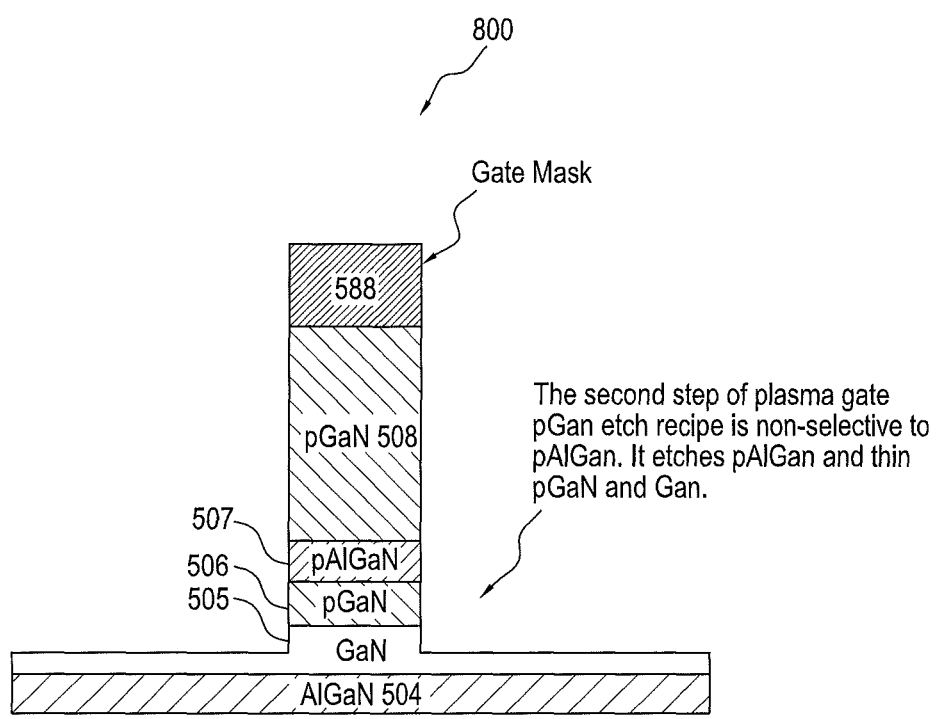
FIG. 8 illustrates a cross-sectional view of the gate structure after a second etch in the process for fabricating the enhancement-mode transistor structure according to the first embodiment of the present invention.

FIG. 8 illustrates a cross-sectional view of the gate structure 800 resulting from the second etch step 800 in the process for fabricating the enhancement-mode transistor structure 500 according to the first embodiment of the present invention. The second plasma gate pGaN etch recipe is non-selective to pAlGaN, and completely etches the pAlGaN layer 507 and pGaN layer 506 layer outside the gate/masked region, and partially etches the GaN spacer 505 outside the gate/masked region (i.e., the etch stops within the GaN spacer 505). The plasma employed in the second etch is. $Cl_2$ or $SiCl_4$. The advantage of the double etch technique of the present invention is that any variation across the wafer from etching the thin pAlGaN etch stop layer and the underlying thin pGaN layer is much less than etching a thick pGaN layer. The approach of the present invention thus leaves a thin layer of GaN above the barrier layer 504 with minimal variation across the wafer.

Figure 9:
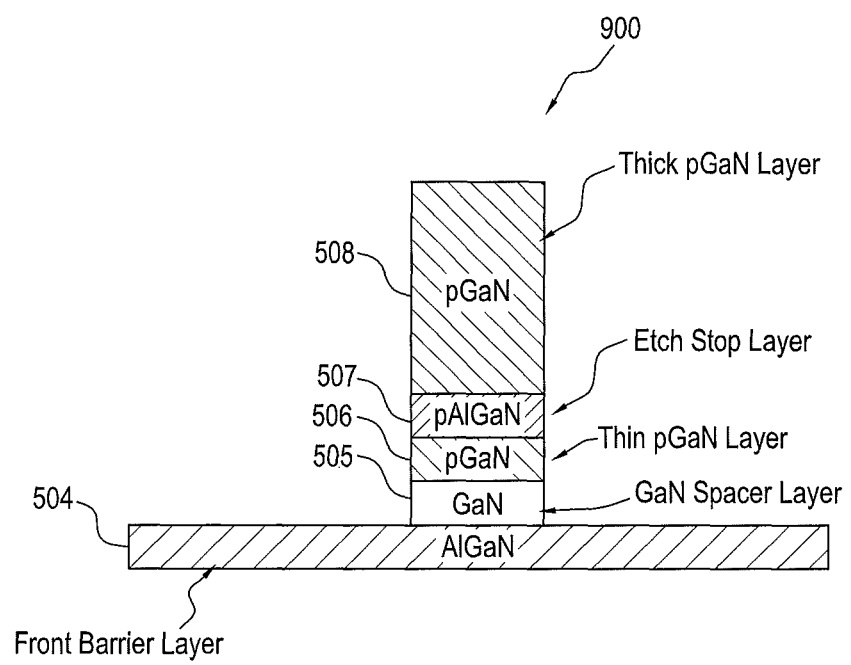
FIG. 9 illustrates a cross-sectional view of an enhancement-mode transistor structure formed according to a second embodiment of the present invention.

FIG. 9 illustrates a cross-sectional view of an enhancement-mode transistor structure 900 formed according to a second embodiment of the present invention. This embodiment differs from the first embodiment in that there is no thin portion of GaN spacer 505 outside of the gate region. A third plasma gate etch with selective etch to remove the GaN spacer 505 outside the gate region may be employed.

Figure 10:
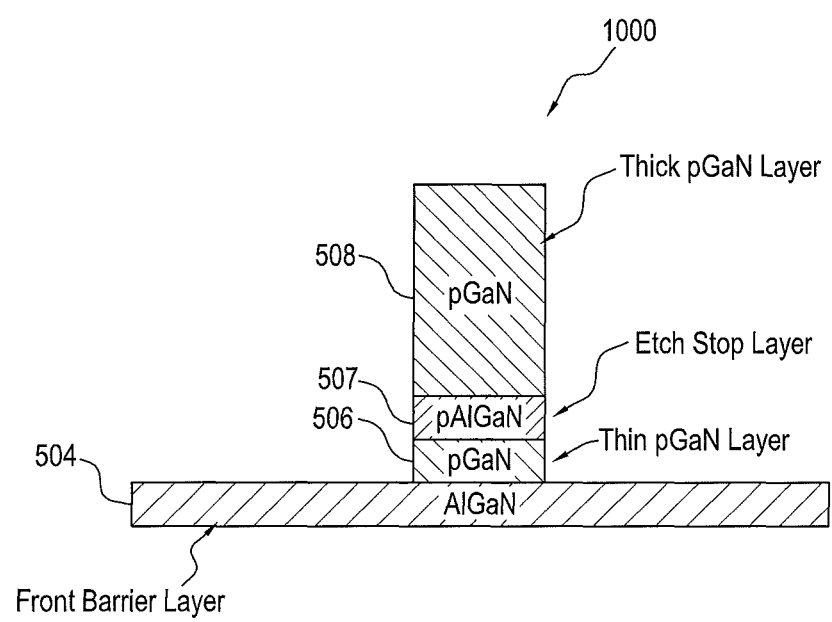
FIG. 10 illustrates a cross-sectional view of an enhancement-mode transistor structure formed according to a third embodiment of the present invention.

FIG. 10 illustrates a cross-sectional view of an enhancement-mode transistor structure 1000 formed according to a third embodiment of the present invention. This embodiment differs from the first embodiment in that there is no GaN spacer 505.

Figure 11:
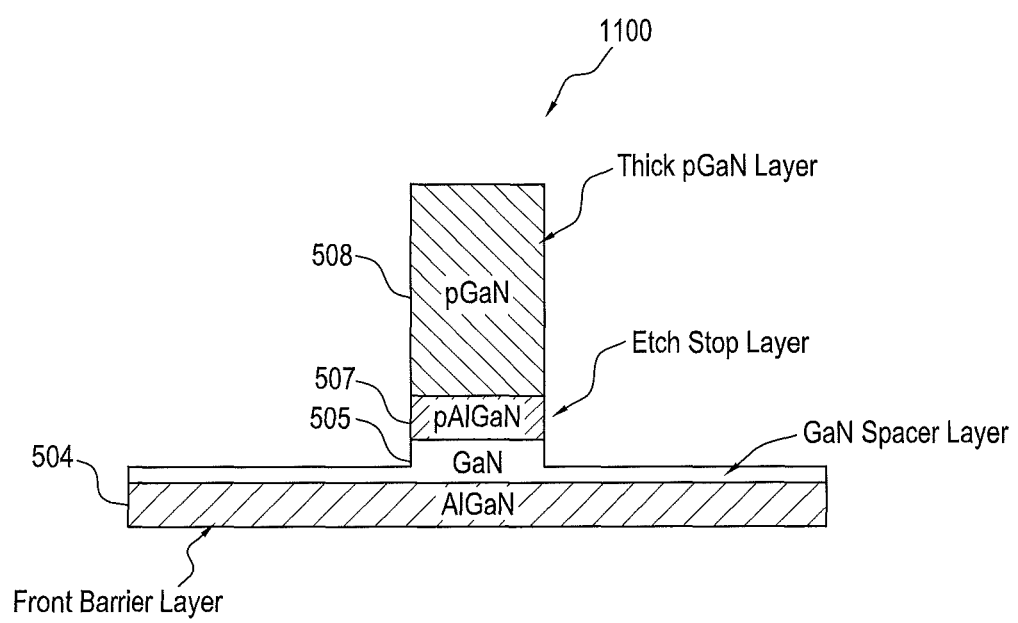
FIG. 11 illustrates a cross-sectional view of an enhancement-mode transistor structure formed according to a fourth embodiment of the present invention.

FIG. 11 illustrates a cross-sectional view of an enhancement-mode transistor structure 1100 formed according to a fourth embodiment of the present invention. This embodiment differs from the first embodiment in that there is no pGaN layer 506.

Figure 12:
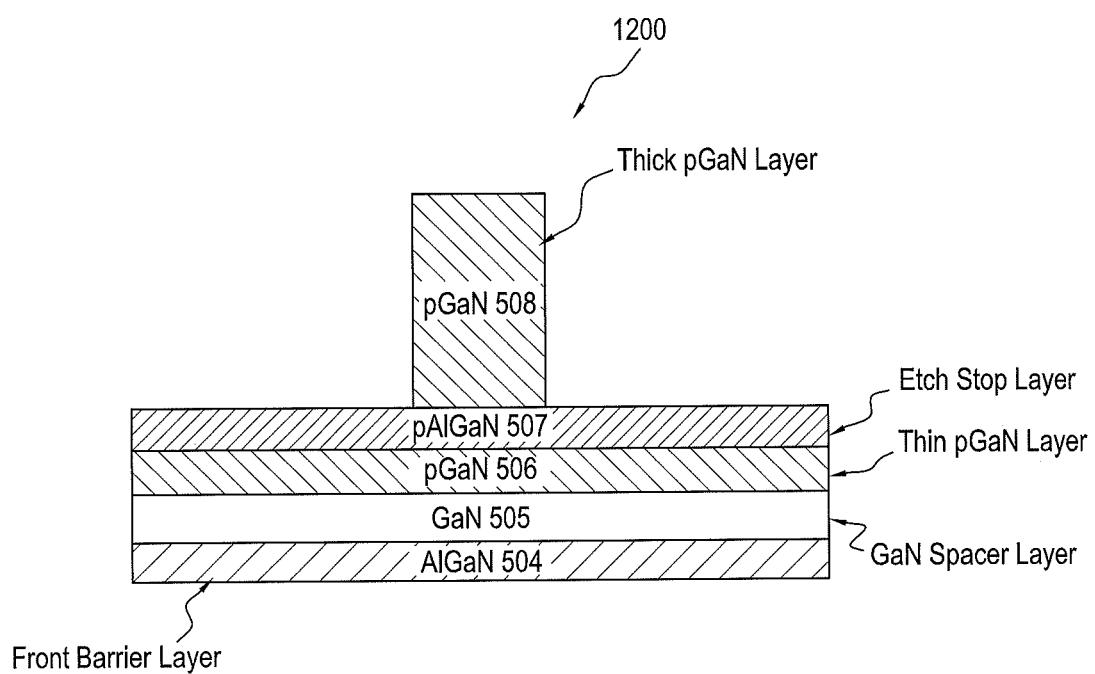
FIG. 12 illustrates a cross-sectional view of an enhancement-mode transistor structure formed according to a fifth embodiment of the present invention.

FIG. 12 illustrates a cross-sectional view of an enhancement-mode transistor structure 1200 formed according to a fifth embodiment of the present invention. This embodiment differs from the first embodiment in that the pGaN layer 506 and pAlGaN layer 507 extend outside of the gate region, and the GaN spacer 505 is of uniform thickness within the gate region (i.e., below the pAlGaN layer 507) and in surrounding areas. In this embodiment, no etching occurs through the p-type Al-containing column III-V material layer 507.

Figure 13:
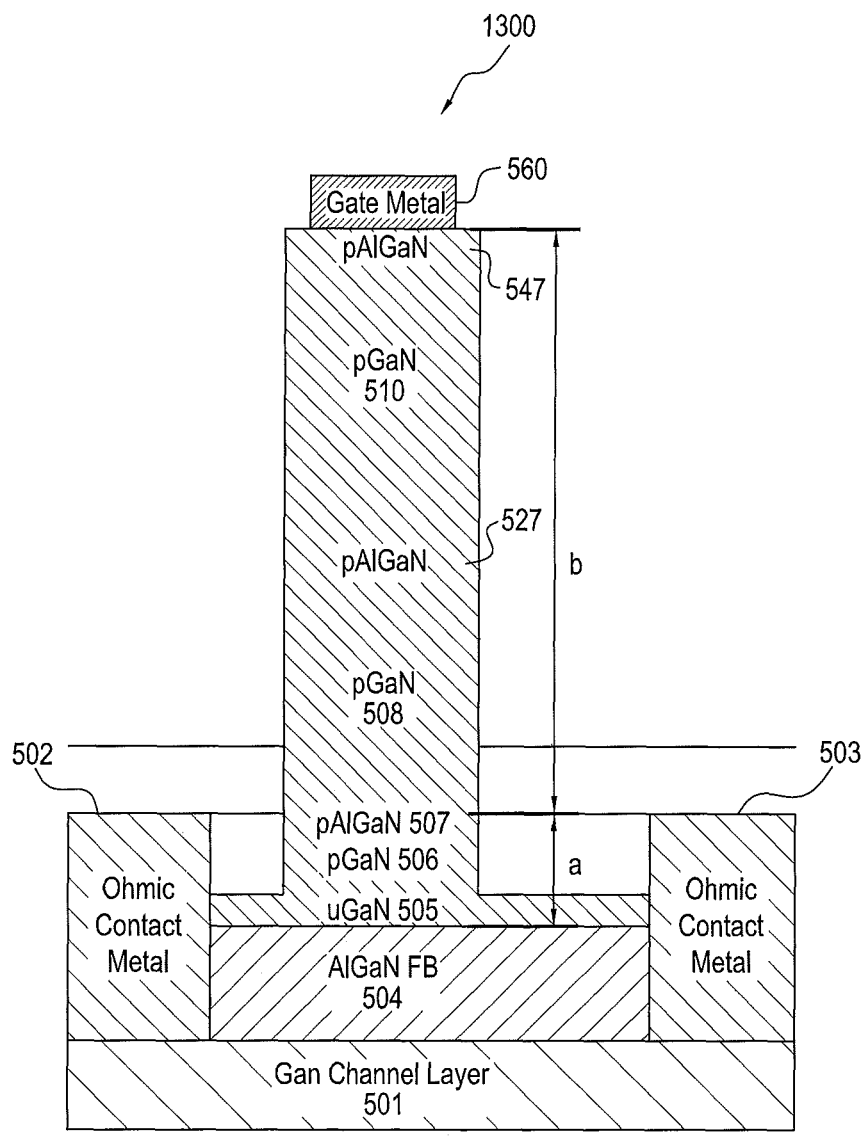
FIG. 13 illustrates a cross-sectional view of an enhancement-mode transistor structure formed according to a sixth embodiment of the present invention.

FIG. 13 illustrates a cross-sectional view of an enhancement-mode transistor structure 1300 formed according to a sixth embodiment of the present invention. In the embodiment of FIG. 13, the transistor gate structure 1300 comprises additional pAlGaN (or pAlInGaN) etch stop layers 527 and 547 and an additional pGaN layer 510 disposed between pAlGaN (or pAlInGaN) etch stop layers 527 and 547. A gate metal 560 is disposed above the top pAlGaN (or pAlInGaN) etch stop layer 547. FIG. 13 also illustrates ohmic contact metals 502, 503 on either side of the barrier layer 504 and are spaced from the gate region. A GaN channel layer 501 is positioned below the barrier layer 504.

As in the prior embodiment, a pAlGaN (or pAlInGaN) etch stop layer 507 is located near the AlGaN barrier layer, where dimension a<b as depicted in FIG. 13. The material 508 above the etch stop layer 507 and the material 506 below the etch stop layer 507 may be pGaN, pAlGaN, or pAlInGaN, and their Al content (if present) is less than the Al content in the etch stop layer 507. The gate may contain more than one pAlGaN layer. These pAlGaN layers may have different Al concentrations and may have different thicknesses. An advantage of the multiple etch stop layers is that the structure allows lower Al content in each etch stop to achieve stopping within the etch stop layers.

Notwithstanding the above-mentioned etching steps illustrated in FIGS. 7 and 8, the various layers (AlGaN barrier layer 504, GaN spacer 505, pGaN layer 506, pAlGaN layer 507, and pGaN layer 508) illustrated in FIG. 6 or other embodiments below and/or in any of the drawings may be deposited or formed (prior to etching) using known processes described for fabricating any of the prior art devices mentioned above or using other conventional processes. Similar conventional deposition or formation processes (i.e., prior to etching) may be employed for any of remaining layers disclosed herein (e.g., AlInGaN front barrier layer 514 in FIGS. 14 and 15, pAlGaN layers 527, 547 in FIG. 13, pAlInGaN layer 517 in FIGS. 14 and 15, and pAlInGaN layers 537, 557 in FIG. 15).

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described in this disclosure may be employed in combination with features in other embodiments described herein, such combinations are considered to be within the spirit and scope of the present invention.

The contemplated modifications and variations specifically mentioned in this disclosure are considered to be within the spirit and scope of the present invention.

The above description and drawings are only to be considered illustrative of specific embodiments, which achieve the features and advantages described herein. Modifications and substitutions to specific process conditions may be made. Accordingly, the embodiments of the invention are not considered as being limited by the foregoing description and drawings.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

The invention claimed is:

1. A method of forming a transistor with a uniform spacer layer in areas surrounding the transistor gate, comprising:
    providing a transistor gate structure comprising:
        a barrier layer;
        a spacer layer disposed above the barrier layer, the spacer layer comprising a column III-V material;
        a first layer comprising p-type or compensated column III-V material disposed above the spacer layer;
        an etch stop layer comprising a p-type Al-containing column III-V material disposed above the spacer layer and the first layer comprising p-type or compensated column III-V material; and
        a second layer comprising p-type or compensated column III-V material positioned above the etch stop layer, the second layer comprising p-type or compensated column III-V material being thicker than the first layer comprising p-type or compensated column III-V material;
    positioning a mask over a gate region of the second layer comprising p-type or compensated column III-V material;
    performing a first etch of the second layer comprising p-type or compensated column III-V material outside the gate region with an etch recipe that is selective to the p-type Al-containing column III-V material of the etch stop layer, such that the etch stops on the etch stop layer;
    performing a second etch through the mask with an etch recipe that is non-selective to the p-type Al-containing column III-V material of the etch stop layer, such that the etch stop layer and the first layer comprising p-type or compensated column III-V material are completely etched outside the gate region covered by the mask, and the entire spacer layer outside the gate region covered by the mask is partially and uniformly etched.

2. The method of claim 1, wherein the spacer layer comprises GaN.

3. The method of claim 1, wherein the first and second layers of p-type or compensated column III-V material comprise pGaN.

4. The method of claim 1, wherein the etch stop layer comprises pAlGaN or pAlInGaN.

5. The method of claim 4, wherein the first and second layers of p-type or compensated column III-V material comprise pAlGaN or pAlInGaN, and the Al content of the first and second layers is less than Al content of the etch stop layer.

6. The method of claim 1, wherein the spacer layer has a thickness of 1 nm-6 nm, the first layer comprising p-type or compensated column III-V material has a thickness of 1 nm-30 nm, the etch stop layer has a thickness of 0.5 nm 2 nm, and the second layer comprising p-type or compensated column III-V material has a thickness of 20 nm-100 nm.

7. The method of claim 1, wherein the second etch results in the spacer layer being thicker in the gate region than outside the gate region, and the thickness of the spacer layer outside the gate region is substantially uniform.

8. The method of claim 1, further comprising an additional etch stop layer disposed above the second layer comprising p-type or compensated column III-V material, and an additional layer of p-type or compensated column III-V material disposed above the additional etch stop layer, wherein the thickness of the structure between the barrier layer and the etch stop layer is less than the thickness of the structure between the etch stop layer and the additional etch stop layer, and wherein an additional etch is performed for the additional etch stop layer, resulting in graduated etching.

9. The method of claim 8, wherein the additional etch stop layer has a different Al concentration and/or a different thickness than the etch stop layer.

* * * * *